United States Patent [19]

Mitsuoka

[11] Patent Number: 5,719,782
[45] Date of Patent: Feb. 17, 1998

[54] FREQUENCY MEASURING APPARATUS AND FREQUENCY MEASURING METHOD

[75] Inventor: Teruyoshi Mitsuoka, Samukawa, Japan

[73] Assignee: Toyo Communication Equipment Co., Ltd., Kanagawa, Japan

[21] Appl. No.: 481,266

[22] PCT Filed: Oct. 19, 1994

[86] PCT No.: PCT/JP94/01758

§ 371 Date: Jun. 7, 1995

§ 102(e) Date: Jun. 7, 1995

[87] PCT Pub. No.: WO95/11456

PCT Pub. Date: Apr. 27, 1995

[30] Foreign Application Priority Data

Oct. 22, 1993 [JP] Japan ................. 5-287657
Dec. 6, 1993 [JP] Japan ................. 5-339693

[51] Int. Cl.[6] .................. H03B 5/32; H03L 1/00
[52] U.S. Cl. .................. 364/484; 364/485; 364/557; 331/158; 331/176
[58] Field of Search .................. 464/484, 485, 464/557; 368/159, 161; 331/66, 69, 158, 176, 44; 364/484, 485, 557; 375/371, 373, 375–376

[56] References Cited

U.S. PATENT DOCUMENTS

| | | | |
|---|---|---|---|
| 4,297,657 | 10/1981 | Frerking | 331/176 |
| 4,380,745 | 4/1983 | Barlow et al. | 331/176 |
| 4,513,259 | 4/1985 | Frerking | 331/176 |
| 4,611,181 | 9/1986 | Fukumura | 331/66 |
| 4,893,097 | 1/1990 | Zwack | 331/176 |
| 4,949,055 | 8/1990 | Leitl | 331/176 |
| 5,126,699 | 6/1992 | Kabler | 331/66 |
| 5,319,324 | 6/1994 | Satoh et al. | 331/158 |
| 5,392,005 | 2/1995 | Bortolini et al. | 331/158 |

FOREIGN PATENT DOCUMENTS

| | | | |
|---|---|---|---|
| 56-116863 | 8/1984 | Japan | G01R 23/10 |
| 63-87003 | 4/1988 | Japan | H03B 5/32 |
| 3-113903 | 5/1991 | Japan | H03B 5/32 |
| 4-65696 | 3/1992 | Japan | G04G 3/02 |

Primary Examiner—Emanuel T. Voeltz
Assistant Examiner—Bryan Bui
Attorney, Agent, or Firm—Koda and Androlia

[57] ABSTRACT

A frequency measuring apparatus for measuring the frequency of an input signal to be measured with high accuracy. The apparatus includes a crystal oscillator for generating an internal reference frequency, a temperature sensor provided on the crystal oscillator, a writable memory and an estimation control device for storing in the memory a correspondence relationship between an absolute frequency to be taken as a reference at a predetermined temperature measured by the temperature sensor and the internal reference frequency as error correction information and estimating the frequency ortho input signal in conformity with the internal reference frequency corrected by the error correction information upon the input signal.

9 Claims, 7 Drawing Sheets

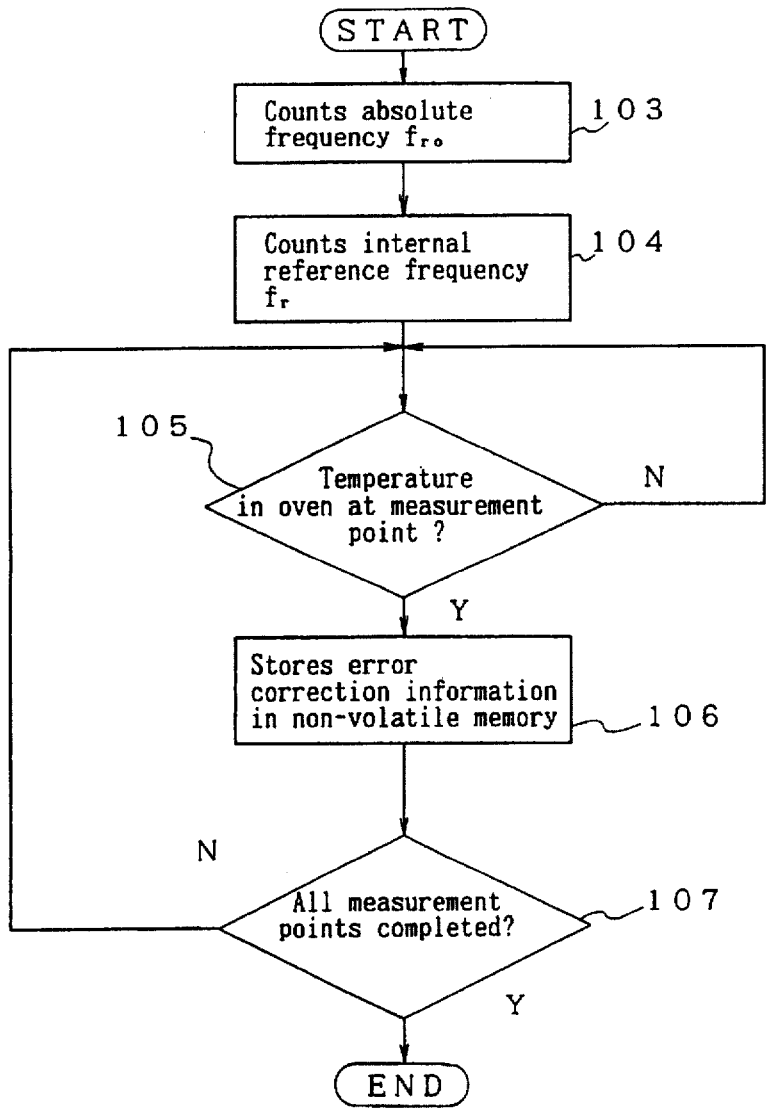

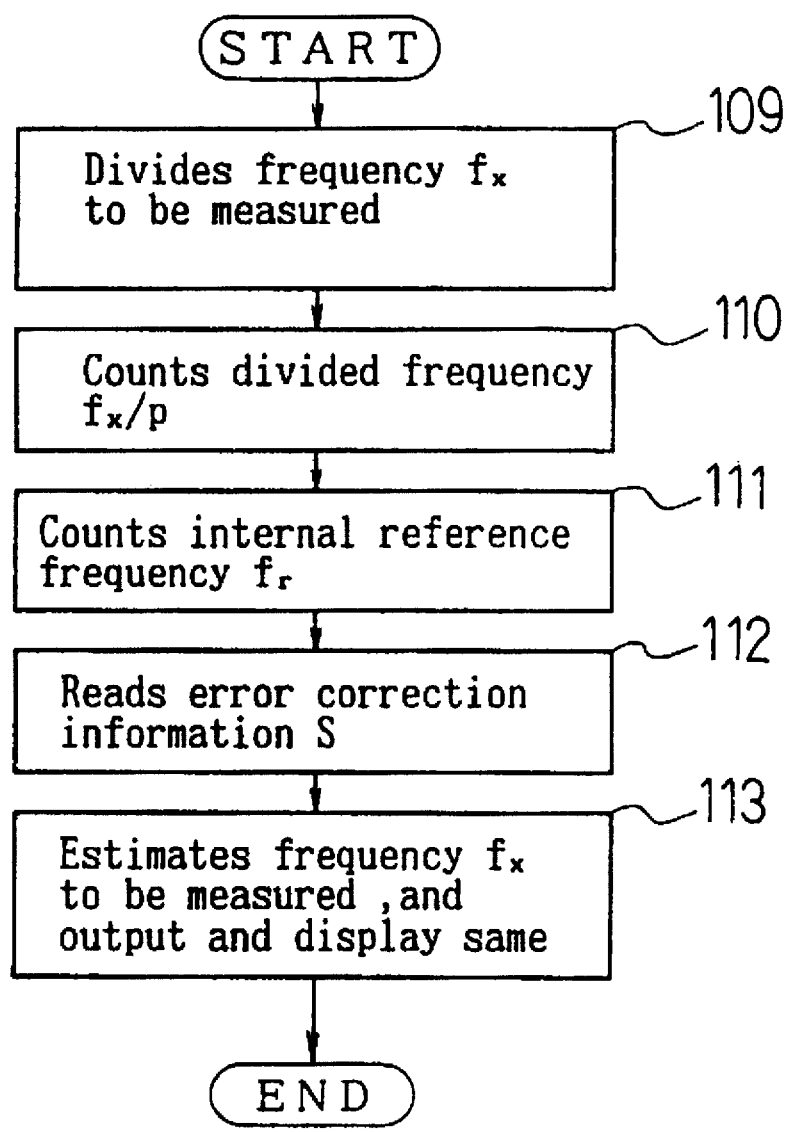

FREQUENCY MEASURING APPARATUS AND FREQUENCY MEASURING METHOD

BACKGROUND OF THE INVENTION

1. Field of the invention

The present invention relates to a frequency measuring apparatus for measuring the frequency of a signal with high accuracy using a crystal oscillator as a reference frequency source, and more specifically to a frequency measuring apparatus and a frequency measuring method wherein there are entirely eliminated the need of high-degree techniques and much labor in manufacture, adjustment, and inspection of conventional crystal oscillators and wherein the accuracy of the measurement is further improved, and further wherein the cost of manufacture of the apparatus is sharply reduced and the apparatus is miniaturized.

2. Description of the Prior Art

An apparatus for measuring the frequency of a signal generally requires a reference frequency source. Such reference frequency sources include the so-called temperature compensated crystal oscillator (TCXO) for the accuracy of measurement up to ±1 ppm, and the so-called oven-controlled highly stabilized crystal oscillator (OCXO) when further higher accuracy is required. These oscillators are manufactured as oscillator units by those skilled in the art. Such an oscillator unit satisfies requirements for the reference frequency source as its unit.

More specifically, the requirements are such that an absolute frequency is ensured at the center of a variable width, that an associated frequency is variable within a predetermined width with use of a variable capacitor in order to moderate a change with the lapse of time in the associated frequency, and that a change in an output frequency falls within a predetermined deviation with respect to environmental changes such as changes with the lapse of time, and in temperature and a power supply.

Manufacturers in this field conventionally design, manufacture, inspect, and ship such oscillators so as to satisfy these requirements. In other words, TCXO and OCXO as conventional reference oscillators require a high-degree technique and labor which can not be dealt with by persons other than those skilled in the art to result in the high cost where a cost rate of a reference oscillator to that of a frequency measuring apparatus including the reference oscillator is increased.

The following is an example of the aforementioned high-degree technique and labor upon manufacturing the Tcxo and Ocxo.

In a required temperature range there is necessary a monotonically decreasing temperature characteristic for a frequency before compensation, so that the frequency is needed to be variable over ±15 ppm in a temperature range of from 0° to 70° C. for example. In addition to this requirement a frequency variation of about ±5 ppm using a variable capacitor, etc., is required for moderating a change with the lapse of time, and further a function to moderate manufacturing tolerance of a crystal oscillator, say ±10 ppm is required. Possibilities of so much frequency variations mean that there must also additionally be taken into consideration frequency variations caused by changes with the lapse of time and temperature changes of circuit components constituting a reactance network for varying an associated frequency.

This in turn causes severe variations of load capacitance viewed from a crystal oscillator which further cause a change in the conditions of an oscillator loop and result in variations of oscillation redundancy and of an output level.

The variations of load capacitance to moderate the change with the lapse of time in an oscillation frequency are equivalent to shifting of the angle of cutting of a crystal and result in a change in the temperature compensation characteristic.

There is further a limitation to the crystal oscillator that a capacitance ratio (a ratio between parallel capacitance and equivalent series resonance circuit capacitance) of the quartz oscillator should be lower, in order for the crystal oscillator to have a required frequency varying function.

The conventional technique suffers from a difficulty of its not ensuring stable oscillation unless the aforementioned complicated problems are solved.

The conventional technique further suffers from a difficulty that since a frequency measuring apparatus and an oscillator are manufactured by different manufacturers both manufacturers do not agree with each other in view of the times for deliveries and the prices thereof, and are obliged to wasteful time and negotiations.

The conventional technique furthermore suffers from a difficulty of its requiring a large-sized mechanical structure in order to satisfy necessary requirements and specifications and hence of its being hindered from realizing a compact frequency measuring apparatus.

A concrete example of a conventional OCXO (oven-controlled highly stabilized crystal oscillator) will be demonstrated in the following for description of the difficulties with the same.

FIG. 11 is a block diagram illustrating an example of the construction of a general function of a conventional OCXO.

In the same figure, numeral 201 is an oven control unit by which a regulated temperature oven 202 is controlled in its temperature to a regulated predetermined temperature. The regulated temperature oven 202 contains part or the whole of an oscillator output unit 203, a crystal oscillator 204, a frequency adjustment unit 205, and part or the whole of a frequency varying unit 206, all of these units constitute an oscillation loop.

One circuit may commonly use part or the whole of the frequency adjustment unit 205 and the frequency varying unit 206. The regulated temperature oven control unit generally keeps accurately and with high stability regulated temperature oven internal temperature at a minimum point temperature of a frequency-temperature characteristic of a crystal oscillator used in the present oscillator, i.e., a turning point temperature on the high temperature side when the characteristic is a cubic curve.

For example, the regulated temperature oven internal temperature should be kept within ±0.1° C. with respect to the minimum point temperature, with its variations kept within 0.01° C. The oscillation/output unit 203 supplies a crystal oscillator with energy required for the crystal oscillator to vibrate in a predetermined mode and outputs oscillation frequency of the crystal oscillator to the outside. For the crystal oscillator 204 there are used those having high stability and less variations with the lapse of time, and the crystal oscillator 204 is designed and manufactured such that the minimum point temperature of the frequency-temperature, characteristic falls within a predetermined temperature range, say, within a range of from 70° C. to 80° C.

The frequency adjustment unit 205 is a circuit for adjusting a variation amount by the frequency varying unit 206 such that an oscillator output at the state of zero of the variation amount falls within a predetermined deviation with respect to a nominal frequency of the oscillation frequency, say, within a range of ±0.5 ppm of the nominal frequency, for the purpose of correction of manufacturing deviation of the foregoing crystal oscillator and other circuit components. The frequency varying unit 206 is a circuit for correcting the change with the lapse of time of the crystal oscillator, for which a variable width of ±0.1 ppm~1 ppm is typically required. It should herein be noticed that the nominal frequency is a reference absolute frequency to be output from the oscillator, i.e., an ideal value for which a certain allowable error range is specified to actual oscillators.

The regulated temperature oven highly stabilized crystal oscillator constructed as above has a difficulty of its being very expensive because a highly accurate adjustment is required upon its manufacture as described in detail below.

In order to manufacture the crystal oscillator such that its frequency at the minimum point temperature falls within a predetermined deviation, very highly accurate and complicated. adjustment process is first necessary. More specifically, although for the crystal oscillator 204 an electrode thereof is formed by deposition of a metal film, plate temperature is different from the minimum point temperature because the crystal plate is overheated by the deposition at that time.

Accordingly, a work to adjust the minimum point temperature of the crystal oscillator and the frequency of the same to desired values depositing the metal film requires very high-degree technique and much labor but with the reduced yield.

Frequency adjustment after assembly of the oscillator is also troublesome. Although the oscillator is generally adjusted to a desired frequency at the temperature in the thermostatic oven while replacing or adding reactive parts, i.e., a capacitor to the oscillator, there must be repeatedly executed a work to take out an oscillation circuit component assembled in the thermostatic oven for each adjustment and adjust it at different temperature from the former situation, and again assemble the component into the thermostatic oven and thereafter return the temperature to the predetermined temperature putting many hours for adjustment of the frequency of the oscillator.

It is further required to check that a change in the load capacity of the oscillation circuit resulted in by adjusting the frequency adjustment unit to correct the manufacturing deviation of the crystal oscillator does not affect the variation performance like an original design. Provided the variation performance is affected by the change in the load capacity of the oscillation circuit, the aforementioned frequency adjustment work is again required after replacing the parts of the frequency variation unit.

Even in the thermostatic oven control function, there is further required a work of the minimum point temperature matching.

More specifically, since the minimum point temperature of the crystal oscillator depends on the cutting angle of the crystal oscillator plate, the minimum point temperature is impossible to fall within ±0.1° C. in view of the limitation of processing accuracy.

Measuring apparatuses such as highly accurate frequency measuring apparatuses and spectrum analyzers require a highly accurate reference frequency signal and conventionally use the aforementioned OCXO output.

The OCXO used for this uses a signal frequency itself output therefrom as a reference signal, so that the absolute value of that frequency must be coincide with a nominal frequency with high accuracy to result in the very high cost of the OCXO occupied in the whole measuring apparatus.

SUMMARY OF THE INVENTION

In order to solve the problems with the prior art, it is an object of the present invention to provide a frequency measuring apparatus and a frequency measuring method wherein high-degree techniques and labor upon manufacturing, adjusting, and inspecting a conventional crystal oscillator used as a reference frequency source are completely eliminated as described above and wherein accuracy of frequency measurement is further improved and the cost of manufacturing the apparatus is sharply reduced together with insurance of miniaturization of the apparatus.

It is another object of the present invention to provide a frequency measuring apparatus and a frequency measuring method using an OCXO wherein minimum point temperature of a frequency-temperature characteristic of a crystal oscillator in the OCXO is kept unchanged with ease and wherein a deviation between an actual oscillation frequency at the minimum point temperature and nominal frequency is removed.

To achieve the above object, a frequency measuring apparatus for measuring the frequency of an input signal to be measured with high accuracy according to the present invention comprises a crystal oscillator for generating an internal reference frequency, a temperature sensor provided on said crystal oscillator, writable memory means, and estimation control means for storing as error correction information a correspondence relation between absolute frequency to be taken as a reference at a predetermined temperature measured with said temperature sensor and the internal reference frequency from said crystal oscillator and estimating the frequency of said input signal upon said input signal being input in conformity with the internal reference frequency corrected by said error correction information.

A frequency measuring method of measuring the frequency of an input signal to be measured according to the present invention comprises the steps of measuring a correspondence relation between said internal reference frequency and the reference absolute frequency at a plurality of temperature measurement points of a crystal oscillator for generating the internal reference frequency, storing said measured correspondence relation in memory means as error correction information, measuring, when said signal to be measured being input, the temperature of said crystal oscillator at that time, reading said error correction information at said measured temperature from said memory means, and correcting said internal reference frequency based upon said read error correction information and estimating the frequency of said input signal to be measured in conformity with the corrected internal reference frequency.

A frequency measuring apparatus for measuring the frequency of an input signal to be measured with high accuracy comprises a highly stable crystal oscillator (OCXO) using a thermostatic oven for generating an internal reference frequency, a temperature sensor for measuring temperature of the thermostatic oven of the OCXO, writable memory means, and estimation control means for executing various estimation control, said estimation control means serving to obtain the temperature of the thermostatic oven measured with said temperature sensor and minimum point information of the crystal oscillator of the OCXO from the internal reference frequency at said temperature and storing them in said memory means, control said OCXO such that said OCXO maintain the minimum point temperature in conformity with the minimum point temperature information from said memory means, and obtain as error correction information a correspondence relation between an absolute frequency at said minimum point temperature to be taken as a reference and the internal reference frequency from the OCXO and store it in said memory means, and further estimate upon said signal to be measured being input the frequency of the same signal in conformity with the internal reference frequency corrected by said error correction information.

A frequency measuring method of measuring the frequency an input signal to be measured with high accuracy comprises the steps of: measuring an internal reference frequency at a plurality of temperature measurement points of a highly stable crystal oscillator (OCXO) using a thermostatic oven for generating said internal reference frequency, estimating minimum point temperature from the information of the internal reference frequency at said plurality of the temperature measurement points, storing the estimated minimum point temperature in memory means, keeping the temperature of the thermostatic oven of the OCXO at said minimum point temperature in conformity with the minimum point temperature from said memory means, measuring a correspondence relation between the absolute frequency to be taken as a reference at said minimum point temperature and the internal reference frequency from the OCXO, storing said measured correspondence relation in the memory means as error correction information, reading said error correction information from said memory means upon said signal to be measured being input, and correcting said internal reference frequency based on the read error correction information and estimating the frequency of the input signal to be measured in conformity with the corrected internal reference frequency.

BRIEF DESCRIPTION OF THE DRAWINGS

FIG. 3 is a flow chart illustrating the entire operation of the frequency measuring apparatus illustrated in FIG. 1;

FIG. 4 is a flow chart illustrating a process of obtaining error correction information illustrated in FIG. 3;

FIG. 5 is a flow chart illustrating a process of measuring a frequency to be measured illustrated in FIG. 3;

DESCRIPTION OF PREFERRED EMBODIMENTS

Figure 1:
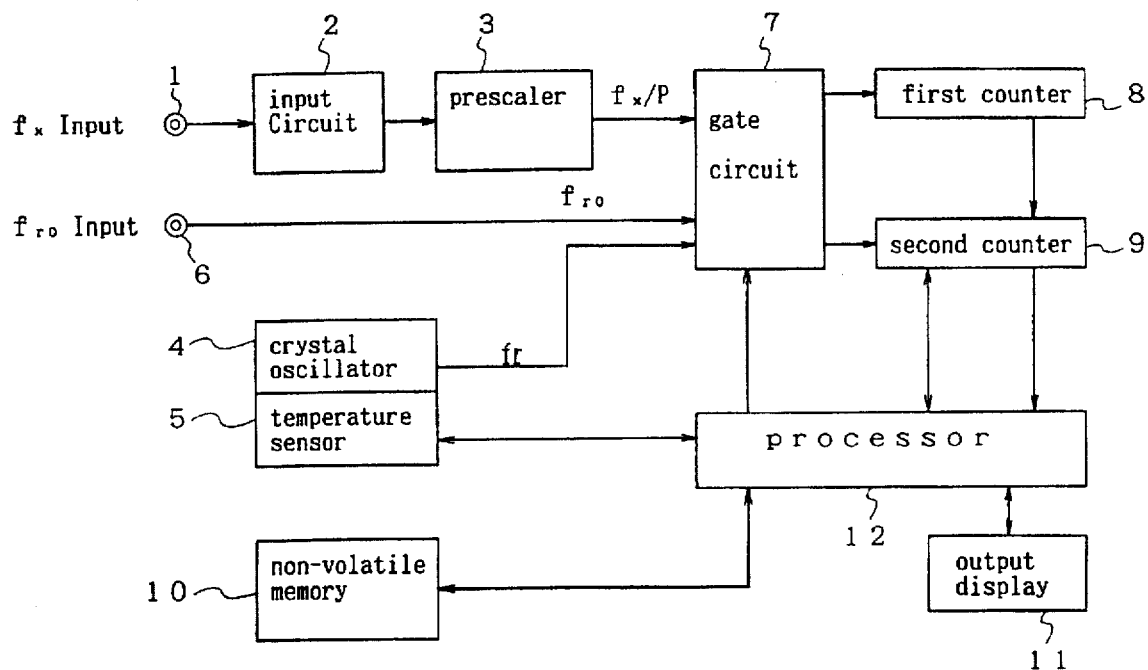
FIG. 1 is a block diagram illustrating a first embodiment of a frequency measuring apparatus according to the present invention.

In what follows, the present invention will be described on the basis of illustrated embodiments. FIG. 1 is a block diagram of a first embodiment of a frequency measuring apparatus according to the present invention.

As illustrated in FIG. 1, the frequency measuring apparatus comprises a first input terminal 1 into which a frequency f x to be measured is input, an input circuit 2 connected to the first input terminal 1, a pre-scaler 3 connected to the input circuit 2, a highly stable crystal oscillator (OCXO) 4, a temperature sensor 5 provided on the OCXO 4, a second input terminal 6 into which an absolute frequency $f_{ro}$ to be taken as a reference is input, a gate circuit 7 connected to the pre-scaler 3, the second input terminal 6, and the OCXO 4, first and second counters 8, 9 connected to the gate circuit 7, a non-volatile memory 10, an output display 11, and a pre-scaler 12 connected to the temperature sensor 5, the gate circuit 7, the second counter 9, the non-volatile memory 10, and the output display 11.

Figure 2:
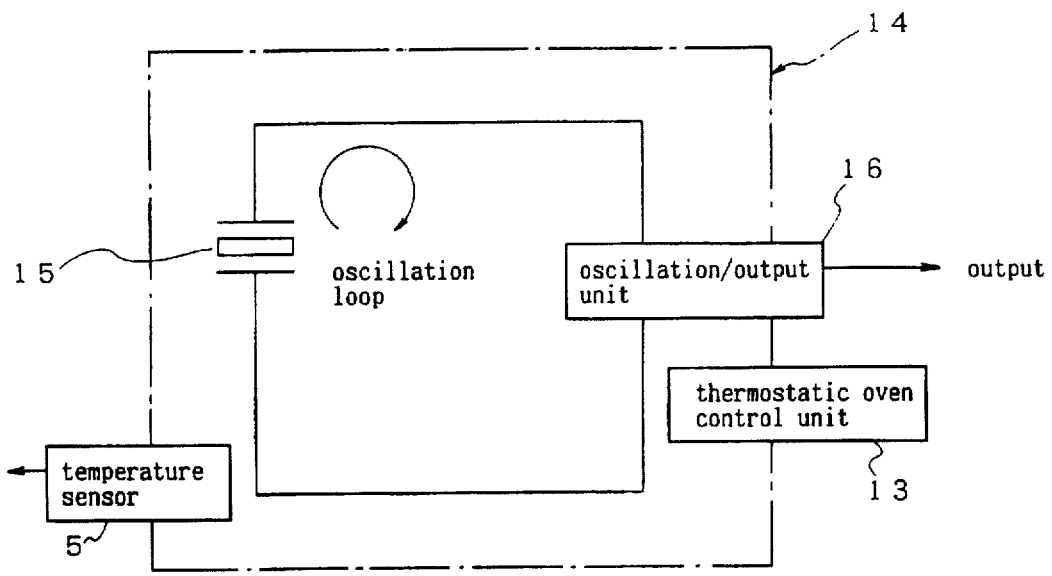
FIG. 2 is an internal block diagram of an OCXO illustrated in FIG. 1.

As illustrated in FIG. 2, the OCXO 4 is constructed such that a crystal oscillator 15 and an oscillation/output unit 16 are disposed in a thermostatic oven 14 forming an oscillation loop. The thermostatic oven 14 includes the temperature sensor 5 provided thereon.

In the following, there will be described the operation of the frequency measuring apparatus constructed as above, i.e., a frequency measuring method.

The operation of the frequency measuring apparatus comprises, as schematically illustrated in the flow chart of FIG. 3, a process 100 of obtaining error correction information wherein there is stored in the non-volatile memory 10 a correspondence relation between the absolute frequency $f_{ro}$ to be taken as a reference at a plurality of temperature measurement points within an operation temperature range in the oven of the OCXO 4 and the internal reference frequency $f_r$ from the OCXO 4 as the error correction information, and a process 101 of measuring a frequency $f_x$ to be measured wherein upon the frequency $f_x$ being input after the process 100 of obtaining the error correction information temperature in the thermostatic oven at that time is measured, and the internal reference frequency $f_r$ from the OCXO 4 is corrected on the basis of the error correction information from the non-volatile memory 10, and further the frequency $fx$ to be measured is estimated in conformity with the corrected internal reference frequency and is output and displayed.

In the following, there will be described the process 100 of obtaining the error correction information with reference to the flow chart of FIG. 4.

In step 103 in FIG. 4, once the absolute frequency $f_{ro}$ (10 MHz in the present case) to be taken as a reference is first input from the second input terminal 6 as an external reference input terminal, the gate circuit 7 is controlled by the processor 12 and the absolute frequency $f_{ro}$ is counted by the second counter 9. Simultaneously, in step 104, the internal reference frequency $f_r$ (10 MHz) from the OCXO 4 is counted by the first counter 8 on the basis of the control of the processor 12.

In step 105, the temperature in the thermostatic oven is measured by the temperature sensor 5 when the first and second counters 8, 9 are in the course of counting, and it is judged by the processor 12 whether or not the temperature in the thermostatic oven is at a measurement point within the operation range.

Once the temperature in the thermostatic oven is judged to be at the measurement point within the operation range in step 105, in step 106 there is estimated a difference or a ratio between the count of the first counter 8 and the count of the second counter 9 at the temperature measurement points in the thermostatic oven (i.e., a difference or a ratio between the internal reference frequency f r and the absolute frequency $f_{ro}$) and is stored in succession in the non-volatile memory 10 in a table map format as the error correction information S. In step 107, it is judged whether or not the error correction information S at all measurement points within the operation range has been estimated and if it has been estimated, the processing has been completed.

It is significant to process the resulting error correction information S in order to speed up the processing at the actual frequency measurement. It is for example considered for the processing that a table of finer temperature sensor output-correction data is prepared using a proper approximation technique or coefficients of an approximate polynomial are previously estimated and are stored in the non-volatile memory 10.

In this case, the table of the finer temperature sensor output-correction data is prepared and is stored in the non-volatile memory 10.

In the following, there will be described the measuring process 101 of the frequency to be measured with reference to the flow chart of FIG. 5.

Once in step 109 in FIG. 5 the frequency $f_x$ to be measured is input from the first input terminal 1, it is divided by the pre-scaler 3 through the input circuit 2. It should herein be understood that a frequency division ratio in the pre-scaler 3 is assumed to be p, the divided frequency is $f_x/p$.

In step 110, the gate circuit 7 is controlled by the processor 12 and the divided frequency $f_x/p$ is counted by the first counter 8. Simultaneously, in step 11, the internal reference frequency $f_r$ from the OCXO 4 is counted by the second counter 9 on the basis of the control of the processor 12.

In step 112, the temperature in the thermostatic bath of the OCXO 4 by the temperature sensor 5 is measured by the processor 12 in the course of the counting by the first and second counters 8, 9 and the error correction information S at the measurement point is read from the non-volatile memory 10.

In step 113, the frequency $f_x$ is estimated in the processor 12 based on the internal reference frequency $f_r$ corrected with the error correction information S, and is sent to the output display 11 for its display.

The estimation of the frequency $f_x$ will be described in detail. Provided the counts of the first and second counters 8, 9 are assumed to be q and r without causing an overflow, holds.

$$f_x = p \cdot q/r \cdot f_r \quad (1)$$

The internal reference frequency $f_r$ of the OCXO 4 has an initial deviation at the ordinary temperature of 25° C. and a deviation caused by a temperature difference from the ordinary temperature with respect to the absolute frequency $f_{ro}$, which should be originally taken as a reference.

Provided these deviations are assumed to be the error correction information S (ppm) holds, $$f_{ro} = (1 + S \times 10^{-6}) f_r \quad (2)$$

and hence $$f_x = \{(p \cdot q)/[r_1(1 + S \times 10^{-6})]\} f_{ro} \quad (3)$$

holds.

The processor 12 estimates the correct frequency $f_x$ to be measured by inserting the internal reference frequency $f_r$, the error correction information S, and the counts into the equations (2), (3).

In accordance with the aforementioned error correction operation there is no need of previously rendering the OCXO 4 to temperature compensation, and a deviation of the frequency $f_x$ from the absolute frequency may be allowed at the normal temperature.

The temperature compensation and the deviation are corrected by the processor 12 based on the temperature sensor output and the contents in the non-volatile memory 10.

Further, also a deviation of the frequency $f_x$ with the lapse of time may be moderated by altering the contents in the non-volatile memory 10 without being moderated for the OCXO 4.

In accordance with the first embodiment, a crystal oscillator can be designed without intending a varying function of a frequency as described above. Accordingly, any crystal oscillator can be designed without requiring expert technical knowledge, and such a crystal oscillator that is very stable with respect to variations with respect to variations with the lapse of time and variations of a power supply excepting a temperature characteristic can be obtained with ease.

There is further eliminated the need of a greatly monotonically decreasing frequency-temperature characteristic, and there is selectable a cutting angle of a crystal which provides least variations of a frequency in a necessary temperature range, say an equi-ripple characteristic, and hence a rate of compensation for such a temperature characteristic, the so-called compressibility is reduced. This also ensures a stable crystal oscillator.

Further, there is no limitation that a capacitance ratio of the crystal oscillator 15 must be reduced, the limitation being caused by providing a frequency varying function to the OCXO 4. Accordingly, there can be used a crystal oscillator having a higher capacitance ratio but having lower variations with the lapse of time. The higher capacitance ratio brings about reduced component sensitivity with respect to a change in any circuit component in the oscillation loop and further brings about the simplification of the oscillation loop. This ensures a very stable oscillator.

It is well known that the capacitance ratio of a crystal oscillator is proportional to a ratio between a plate area and an electrode area. Reduction of the electrode area causes vibration energy to be concentrated to the center of the plate and hence strain from a support system and the influence of relaxation of the strain with the lapse of time to be reduced.

Provided the number of overtones is assumed to be n, the capacitance ratio is proportional to the square of n. Provided the number of overtones is selected to be 3 or 5, sensitivity to a change in the electrode (relaxation of chemical change or strain) can be correspondingly reduced.

With the present technology, temperature measurement is achieved very inexpensively and with high accuracy, say, with a resolution of 0.01° C. A thermostatic oven with temperature stability of 0.001° C. is realizable using a commonly available thermistor. Stability and reproducibility of the thermistor have been established. An electrically erasable/writable non-volatile memory (EEPROM) with satisfactory capacitance is inexpensively available. The apparatus of the present embodiment is therefore manufactured easily by, persons other than those skilled in the art without causing any difficulty of accuracy.

In the following, there will be described a first modified example of the first embodiment of the frequency measuring apparatus according to the present invention with reference to FIG. 6.

Figure 6:
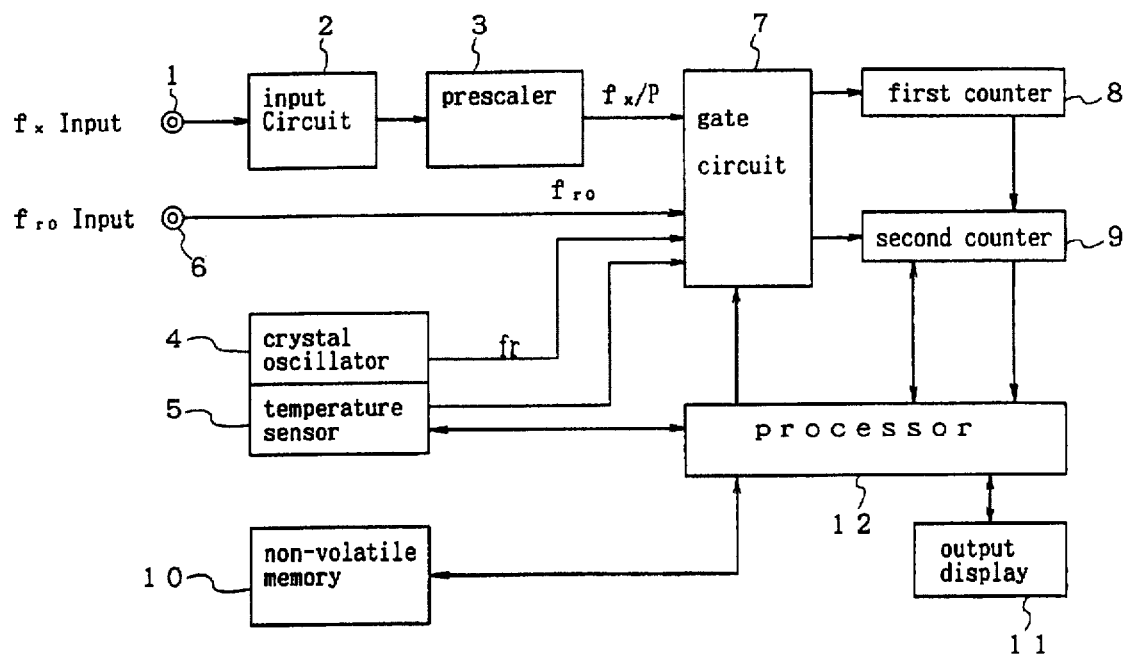
FIG. 6 is a block diagram illustrating a first modified example of an embodiment of the frequency measuring apparatus illustrated in FIG. 1.

The first modified example is to realize the temperature measurement by the aforementioned temperature sensor 5 inexpensively with low power consumption and high accuracy, and is constructed as illustrated in FIG. 6 such that the sensor output of the temperature sensor 5 is connected not with the processor 12 but with the gate circuit 7 for temperature measurement by the first or second counter 8 or 9. Other construction is identical to that of the embodiment illustrated in FIG. 1.

In the first modified example, the processor 12 activates the temperature sensor 5 at the time temperature measurement is necessary, and provides a command so as to generate a pulse having a width corresponding to temperature. The sensor output of the temperature sensor 5 is fed to the gate circuit 7. The processor 12 instructs the gate circuit 7 such that the first or second counter 8 or 9 counts the output fr of the OCXO 4 only when the temperature sensor output is possible.

With the construction, high resolution temperature measurement is ensured only with slight addition to the circuit of the frequency measuring apparatus. More specifically, the first or second counter 8 or 9, that is originally to measure frequency, has a sufficient number of figures (e.g., decimal 7 figures). Thus, the high resolution temperature measurement is ensured.

Figure 7:
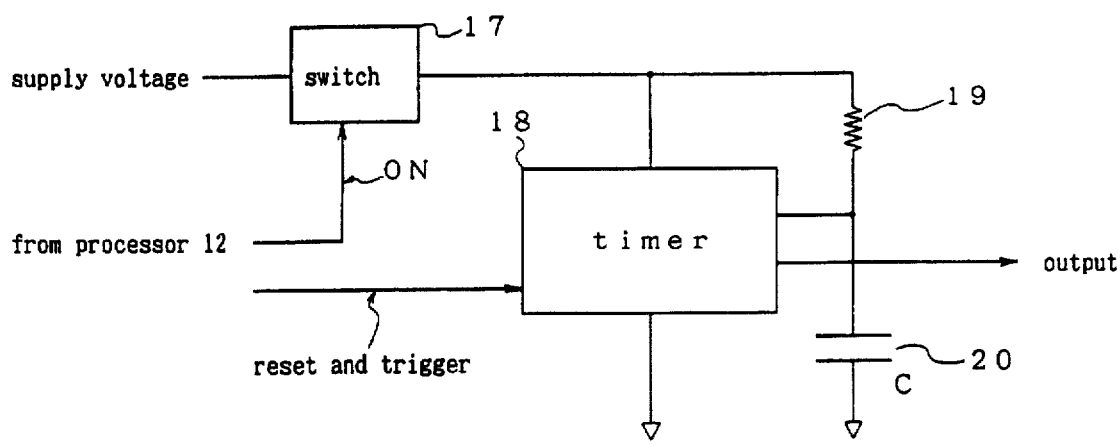
FIG. 7 is a circuit diagram of a temperature sensor in the first modified example of the embodiment of the frequency measuring apparatus illustrated in FIG. 1.

FIG. 7 is a concrete circuit diagram of the temperature sensor 5 in the first modified example.

With the temperature sensor 5, highly accurate ( e.g., 1/100° C.) temperature measurement is ensured with very little consumed power.

The temperature sensor 5 comprises, as illustrated in FIG. 7, a switch 17 connected to power supply voltage, a timer 18 connected to the switch 17, a thermistor 19 connected to the switch 17 and the timer 18, and a capacitor 20 connected to the thermistor 19 and the timer 18.

Reproducibility of stability of the thermistor 19 as a temperature sensitive component has been technically satisfactorily established at present. The time 18 uses a CMOS 555 timer that is an industrial standard. The timer 18 includes therein a resistor for dividing voltage between a power supply and an earth terminal, and hence consumes slight power, less than 1 mW at all times.

For achieving less power consumption, the processor 12 switches the power supply on only upon the measurement. The pulse width from the timer 18 is 1.1 times a product of the resistor of the thermistor 19 and the capacitance 20. No voltage is applied to the thermistor 19 and the timer 18 at ordinary times to prevent error from being produced owing to self-heating, the error causing a trouble upon the temperature measurement.

In the following, there will be described a second modified example of the first embodiment of the frequency measuring apparatus according to the present invention.

The second modified example is to speed up the estimation of the frequency $f_x$ to be measured based on the error correction information S and the internal reference frequency $f_r$, in which the OCXO 4 is previously designed such that the error correction information S is securely negative within a necessary temperature range.

More specifically, provided the error correction information S is negative, in an equation, which is obtained by rewriting the aforementioned equation (3), t surely gets 1 or more.

$$f_x = [(p \cdot s)/r] * [1/(1 + S \times 10 - 6)] * f_{r0} \quad (4)$$
$$= [(p \cdot q)/r] \cdot t \cdot f_{r0}$$

Since t is a value very close to 1, holds, and hence a product of Δt having relative small figures may be executed without considering a sign thereof.

$$f_x = [(p \cdot q)/r] * (1 + \Delta t) f_{r0} \quad (5)$$

Δt may be obtained by referring to a table of the nonvolatile memory 10 based on the temperature sensor output at a necessary time interval. It is well known that processing time of multiplication in the processor 12 is shorter as the number of figures is smaller with no sign compared with the case with any sign. Provided Δt is secured to be always positive, it is effective for shortening of the processing time.

It is not difficult to design and manufacture the OCXO 4 such that the error correction information S is surely negative within a necessary temperature range. That is, provided a higher capacitance ratio oscillator is used as described previously, component sensitivity of the oscillator to other oscillation circuit components is low and hence the oscillator is prevented from being affected by variations of the circuit components constituting the oscillation loop.

Since a crystal oscillator for use in the present invention is manufactured at a cutting angle close to the so-called zero temperature coefficient, variations of the temperature characteristic thereof are also reduced. It is therefore not difficult to finely adjust the oscillator with relatively high accuracy, say, at +10 ppm above the object reference frequency.

In the following, there will be described a packaging (i.e., external peripheral structure) of the OCXO 4 and the temperature sensor 5 in the first embodiment of the frequency measuring apparatus according to the present invention with reference to FIG. 8.

It is first supposed that the frequency measuring apparatus according to the present invention is a module inserted into an extension slot of a personal computer. Such a module has features: it is thin, it is nonobvious that what module is inserted into an adjacent slot, and the rise of internal temperature is greater and an air flow by a fan is existent.

Figure 8:
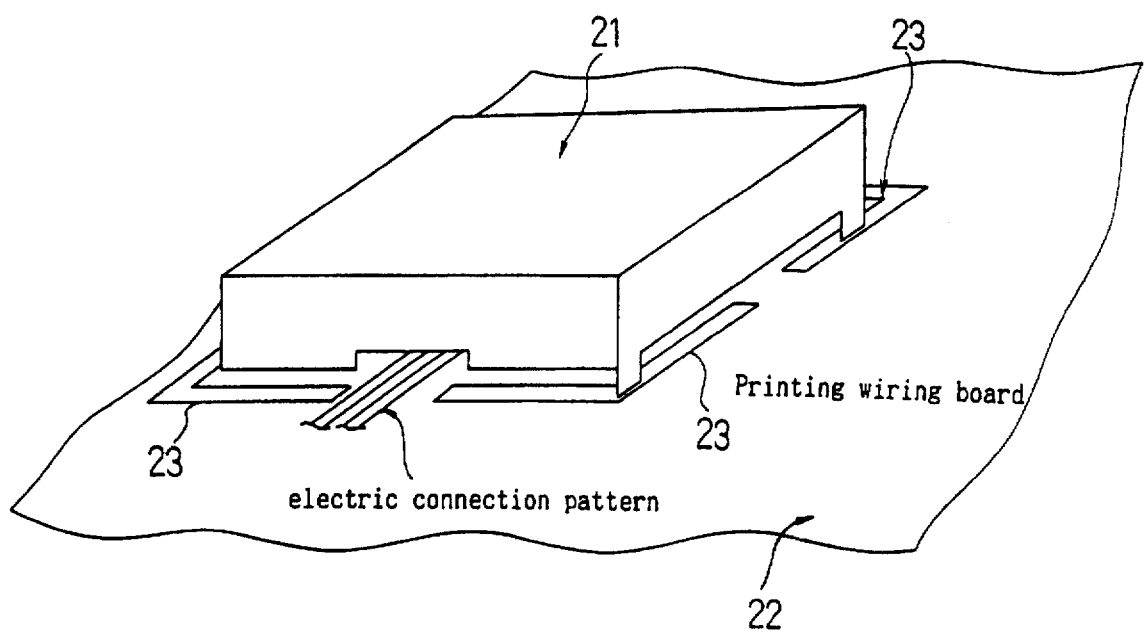
FIG. 8 is a perspective view illustrating a packaging structure for the OCXO and a temperature sensor in the frequency-measuring apparatus illustrated in FIG. 1.

FIG. 8 is a perspective view of a package structure of the OCXO 4 and the temperature sensor 5 of a frequency measuring apparatus which ensures accurate frequency correction even under such severe conditions.

A crystal oscillator associated with the present invention has reduced component sensitivity but allows the crystal oscillation loop to get high impedance. It is therefore preferable that the OCXO 4 and the temperature sensor 5 are electrically shielded with a metal container 21 which is in turn provided with heat capacity to prevent an internal temperature change therein from being increased.

Although in FIG. 8 the metal container 21 is depicted so as to cover only one surface of the printed circuit board 22, it is preferable to construct the back surface of the same in the same manner. Use of a surface mounting technique (SMT) ensures that the back surface is formed as one metal plate.

The package is devised such that thermal resistance against heat conduction from the printed circuit board 22 is increased. More specifically, a groove 23 is formed around the OCXO 4 and the temperature sensor 5 excepting a necessary portion to maintain electrical connection and mechanical strength by making use of a mold or routing. Hereby, for the OCXO 4 and the temperature sensor 5 thermal time constant for several minutes is ensured even under the aforementioned severe conditions.

Further, hereby, error due to a difference between the thermal time constants of the crystal and the temperature sensitive component which is conventionally likely to be produced in temperature compensation of this type can be moderated and error due to a time difference between temperature measurement and frequency measurement following a steep temperature change can be reduced to be negligibly small. This is also effective to reduce on overhead for the temperature measurement and for obtaining a correction factor for the frequency measurement by lengthening repetition time of the temperature measurement.

Although in the first embodiment the case of the use of the OCXO as the crystal oscillator was described, it is also applicable to frequency measuring apparatuses using a temperature compensation crystal oscillator (TCXO) and other types of crystal oscillators.

In the following, there will be described a second embodiment of the frequency measuring apparatus according to the present invention.

Although the foregoing first embodiment was applicable also to frequency measuring apparatuses using crystal oscillators other than the OCXO, the present second embodiment is applicable only to Ocxo which can improve accuracy by forcing it to maintain minimum point temperature of the frequency-temperature characteristic of a crystal oscillator.

In the second embodiment, there is different the operation of a portion composed of the OCXO 4, the temperature sensor 5, the non-volatile memory 10, and the processor 12 in the first embodiment illustrated in FIG. 1. Accordingly, the second embodiment will be described with reference to FIG. 9 illustrating a block diagram only of the foregoing different portion.

Figure 9:
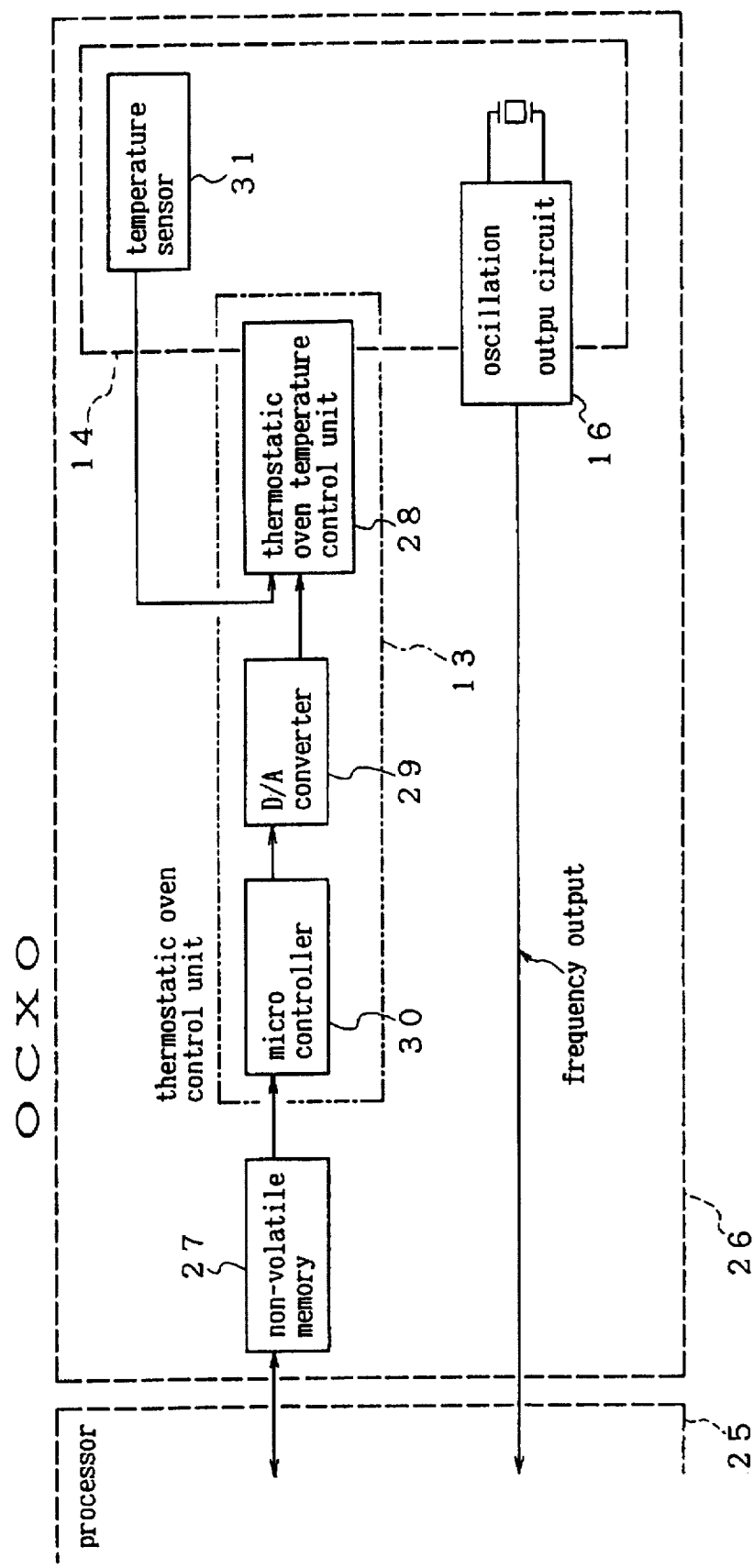
FIG. 9 is a block diagram of a portion of a second embodiment of the frequency measuring apparatus according to the present invention.
Figure 10:
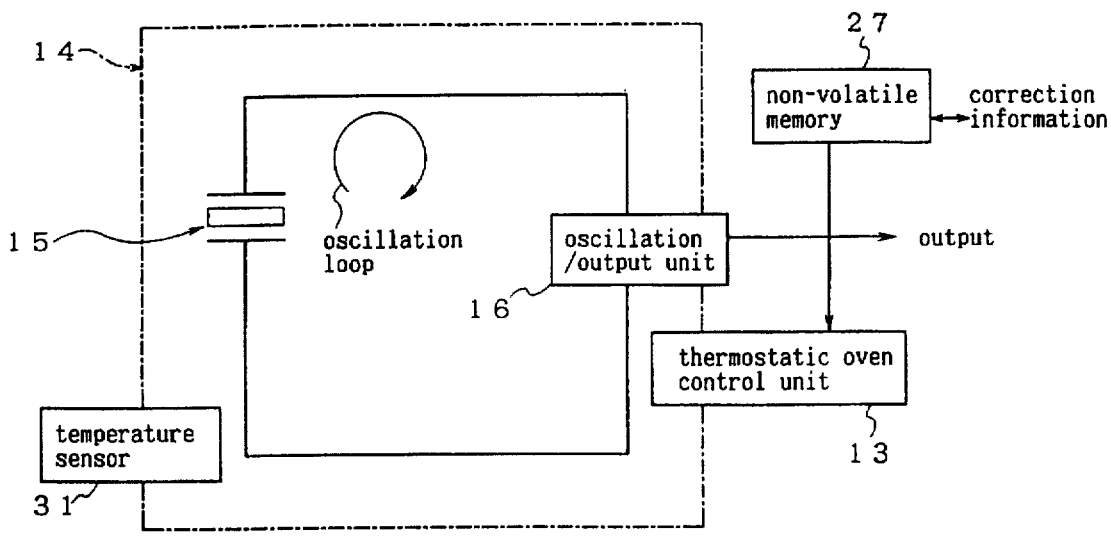
FIG. 10 is an internal block diagram of the OCXO illustrated in FIG. 9.
Figure 11:
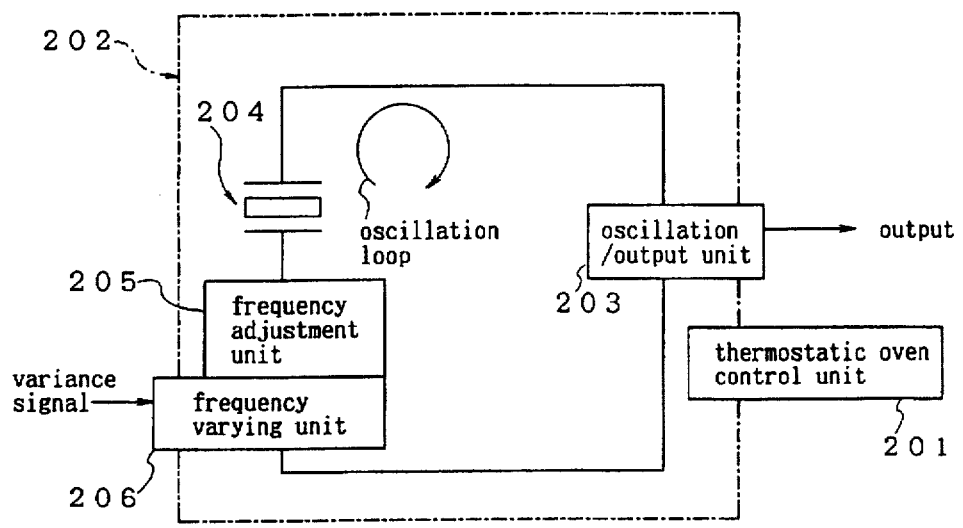
FIG. 11 is a block diagram of a conventional OCXO.

The second embodiment includes an OCXO 26 and a processor 25 as illustrated in FIG. 9. The OCXO 26 is constructed such that a crystal oscillator 15 and an oscillation/output unit 16 both forming an oscillation loop are disposed in a thermostatic oven 14 controlled to predetermined temperature by a thermostatic oven control unit 13 and a non-volatile memory 27 is provided on the thermostatic oven control unit 13 as illustrated in FIG. 10. Further, as illustrated in FIG. 9, the thermostatic oven 13 includes a thermostatic oven temperature control unit 28, a digital/analog converter (D/A) 29, and a micro controller 30. The micro controller 30 reads information stored in the non-volatile memory 27 and transmits it to the thermostatic oven temperature control unit 28 through the D/A converter 29:

A temperature sensor 31 is provided in the thermostatic oven 14, an output from which is supplied to the thermostatic oven temperature control unit 28 to monitor temperature in the thermostatic oven and control it to arbitrary temperature.

A quartz plate is cut to substantially obtain desired minimum point temperature for the purpose of obtaining the minimum point temperature of the crystal oscillator 15, and a proper thickness electrode supposed to substantially yield a desired oscillation frequency is deposited on the crystal plate. The temperature in the thermostatic oven is altered upon adjustment of the OCXO and the oscillation frequencies at respective temperatures are detected to specify the minimum point temperature. More specifically, the processor 25 supplies first temperature information to the memory 27, and simultaneously the microcomputer 30 reads the information and transmits it to the thermostatic oven temperature control unit. 28 through the D/A converter 29 whereby the temperature in the thermostatic oven is adjusted to the first temperature.

Once the interior of the thermostatic oven reaches the first temperature, the processor 25 measures an oscillation output frequency of the OCXO highly accurately (about $10^{-8}$ for example) and stores it in a memory device included in the processor.

The processor 25 then supplies second temperature information higher than the first temperature to the memory and likewise assumes the temperature in the thermostatic oven to be second temperature, and thereafter measures the oscillation output frequency of the OCXO and estimates a difference between the frequency at the first temperature and the frequency at the second temperature and stores it in the memory.

Identical control is executed in succession at a predetermined temperature interval to obtain three or more to frequency-temperature data.

The control is executed until a difference between the n-th frequency $f_n$ and the (n–1)-th frequency $f_{n-1}$ becomes negative, i.e., $f_{n-1}-f_n<0$ is attained, and on the basis of the result the minimum point temperature of the crystal oscillator 15 of the OCXO is estimated.

Although the minimum point temperature is approximately estimated from the resulting 3 or more information, for more accurately detecting the minimum point temperature a plurality of temperatures are searched such that the frequency difference $f_{n-1}-f_n$ is substantially zero. More specifically, in this method the temperature in the thermostatic oven is altered in succession as described above and a difference between oscillation frequencies at successive two temperatures is estimated. As the difference becomes smaller, the amount of a change in the next temperature is reduced. Hereby, data substantially coincident with a frequency-temperature characteristic curve in the vicinity of the minimum point temperature is obtained and hence detection of accurate minimum point temperature is ensured.

The minimum point temperature information obtained in such a manner is stored in the non-volatile memory 27 following a predetermined format.

Once the minimum point temperature information is stored in the memory 27, for the OCXO thereafter the thermostatic oven control unit 13 is actuated following the minimum point temperature information stored in the memory 27 to control the thermostatic oven such that the interior of the same reaches the minimum point temperature and hence the oscillation frequency is kept unchanged.

Upon adjustment of the OCXO so controlled to the minimum point temperature, the oscillation output frequency is measured to obtain difference information (frequency deviation information) between it and nominal frequency (absolute frequency to be taken as a reference, which information is in turn stored in the non-volatile memory 27. Error of the associated frequency is measured with a highly stable highly accurate frequency measuring apparatus prepared separately, as a matter of course.

Although basic memory information required in the second embodiment is as described above, provided the minimum point temperature adjustment for the thermostatic oven is as usual, information to be stored in the non-volatile memory is only the minimum point temperature information and the difference information between the oscillation frequency at that temperature and the nominal frequency (absolute frequency to be taken as a reference).

A standard frequency and the output frequency of the present oscillator are compared with each other in a final inspection stage and a result of the comparison is stored in the non-volatile memory 27, with its deviation expressed in the form of ppm, Hz, or a coefficient (1.00001234 for example) or the absolute frequency for example.

With the construction described above, even though the minimum point temperature of a crystal oscillator used is varied for each product, it is automatically detected and stored in the non-volatile memory 27 whereby the thermostatic oven is kept unchanged in its interior at the minimum point temperature thereof so that a resulting oscillation frequency is always stably coincident with that at the minimum point temperature. Thus, the need of a complicated minimum point temperature adjustment is eliminated.

In the foregoing OCXO simultaneously with the minimum point temperature information the difference information between the oscillation frequency at that minimum point temperature and the nominal frequency is output from the nonvolatile memory 27, so that provided in a frequency measuring apparatus using the OCXO the OCXO output frequency information is corrected on the basis of the difference information output simultaneously likewise the case, in the first embodiment, absolutely accurate frequency information is ensured for insurance of very high accuracy measurement.

The following information is conveniently stored in the foregoing non-volatile memory additionally to the above description.

Although a high accuracy measuring apparatus is a system where calibration is regularly performed and measurement error is proved to be within an allowable limit, the OCXO is likewise an object to be corrected provided it is used as a measuring apparatus.

For this, provided a calibration date and a calibration value are first stored in the non-volatile memory, details of the calibration can be known by reading them at need.

Secondly, also storage of data concerning a long-term aging characteristic (ppm/year) and a short-term aging characteristic (ppm/day) or data concerning the time the frequency of the OCXO is stabilized after power is supplied thereto and the tendency of a change in that time in the memory brings about convenience to users.

More specifically, generally in high accuracy measuring apparatuses an oscillator with required stability (aging characteristic rank) is frequently mounted thereon through a plug-in system in response to desired measurement accuracy and an aging rank of an oscillator used for measurement data is sometimes entered, so that these pieces of information are previously stored in the memory, which are in turn read out through a processor disposed on the side of the measuring apparatus conveniently for display and printing. Particularly, aging characteristic information ensures a clue to know the number of effective figures of an oscillation frequency when the OCXO is used so that the information is effectually used on clarifying measurement accuracy.

Further, additionally to the above description lot numbers and manufacturing numbers of oscillators and Ocxo and dates of manufacture of the formers may be stored at need in the non-volatile memory.

Furthermore, in accordance with the second embodiment, many processes concerning a conventional OCXO are reduced and the low cost is ensured, as described below.

Since there is no need of adjusting and varying an associated frequency using an electronic circuit, there is eliminated a limitation to a capacitance ratio of a crystal oscillator, i.e., a ratio of parallel capacitance of the crystal oscillator and capacitance of an equivalent series resonance circuit. In contrast, although for making variable an oscillation frequency in an oscillation circuit it is necessary to reduce a capacitance ratio, the limitation is eliminated and the capacitance ratio can be selected to be larger.

It is well known that a capacitance ratio of a crystal oscillator is proportional to a ratio of a plate area and an electrode area. Provided the electrode area is reduced, vibration energy is more concentrated at the center of the plate to reduce strain from a support system and the influence of a change with the lapse of time in the strain. Since the capacitance ratio is also proportional to the square of the number of overtones, provided a higher order overtone is selected, sensitivity to a change in the electrode (relaxation of a chemical change and strain) can correspondingly be reduced.

Further, since a frequency adjustment is done to moderate the manufacturing deviation of a crystal oscillator by altering the constant of a reactance network in the oscillation loop, there is eliminated inconvenience of a required negative resistance on the side of an oscillation circuit being sharply varied, so that variations of oscillation loop conditions are eliminated to ensure a stable output with predetermined oscillation redundancy at all times.

Furthermore, effect of the OCXO on circuit construction is also greater.

More specifically, there is eliminated the need of a frequency adjustment unit and a frequency varying unit in the oscillation loop to improve the reliability of the circuit and eliminate the possibility of a change in the output frequency of the oscillator resulted in following a change with the lapse of time when circuit components are heated to high temperature. Particularly, a glass trimmer condenser for mechanical variation, a varactor diode for electronic variation, a potentiometer, and a reference voltage source and the like are generally used for provision of a frequency variation function, and reliability of these parts is lower than general passive parts so that a reliability improvement by the elimination thereof will be easily understood.

More specifically, a network of a frequency adjustment unit and a frequency varying unit in a conventional OCXO is very complicated and a greater volume component such as a glass trimmer condenser is used.

Accordingly, elimination of these components obviously reduces the size of the thermostatic oven and simultaneously reduces a consumed current.

Furthermore, each of the aforementioned non-volatile memory, microcomputer, and D/A converter is easily commercially available in the form of a single chip of a miniature package, and hence an integrated circuit unifying them is also easily available so that any influence on the cost, volume, and reliability can be restricted to a degree not troubled actually.

Additionally, use of a microcomputer also for the thermostatic oven control ensures higher degree nonlinear control than mere analog proportional control such as a conventional OCXO. For example, there is also ensured such a temperature change as minimizing a thermal transient phenomenon possessed by an oscillator.

Although in the above embodiments there was described the case where an OCXO is used as a crystal oscillator, the present invention is likewise applicable to frequency measuring apparatuses using a temperature compensation crystal oscillator (TCXO) and crystal oscillators of other types without being limited to the above embodiments.

What is claimed is:

1. A frequency measuring apparatus for measuring the frequency of an input signal to be measured with high accuracy comprising:

a crystal oscillator for generating an internal reference frequency;

a temperature sensor provided on said crystal oscillator;

writable memory means;

estimation control means for storing in said memory means a correspondence relation between an absolute frequency to be taken as a reference at a predetermined temperature measured by said temperature sensor and the internal reference frequency from said crystal oscillator as error correction information, and estimating the frequency of said input signal to be measured in conformity with the internal reference frequency corrected by said error correction information; and a display means for displaying a frequency value obtained by said estimation control means.

2. A frequency measuring apparatus according to claim 1 wherein said crystal oscillator comprises an oven-controlled crystal oscillator (OCXO) using a thermostatic oven, and said temperature sensor measures temperature in the thermostatic oven.

3. A frequency measuring apparatus according to claim 1 wherein said crystal oscillator is constructed such that an output frequency of said crystal oscillator is surely higher than an object reference frequency within an operation temperature range.

4. A frequency measuring apparatus according to claim 1 wherein said crystal oscillator and said temperature sensor are formed on the same printed circuit board as that of other electronic circuits, and a groove is provided around said crystal oscillator and said temperature sensor such that said crystal oscillator and said temperature sensor provide thermally higher resistance, and further said crystal oscillator and said temperature sensor are surrounded with metal.

5. A frequency measuring method of measuring the frequency of an input signal to be measured with high accuracy comprising the steps of:

measuring a correspondence relation between an internal reference frequency and a reference absolute frequency at a plurality of temperature measurement points of a crystal oscillator for generating said internal reference frequency;

storing said measured correspondence relation in memory means as error correction information;

measuring, when said signal to be measured is input, the temperature of said crystal oscillator at that time;

reading said error correction information at said measured temperature from said memory means;

correcting said internal reference frequency based on said read error correction information and estimating the frequency of the input signal to be measured in conformity with the corrected internal reference frequency; and displaying a value of frequency of said input signal which is obtained in said step of estimating.

6. A frequency measuring apparatus for measuring the frequency of an input signal to be measured with high accuracy comprising:

an oven-controlled crystal oscillator (OCXO) using a thermostatic oven to generate an internal reference frequency;

a temperature sensor for measuring temperature in the thermostatic oven of said OCXO;

writable memory means;

estimation control means for executing various estimation control; and a display means for displaying a frequency value obtained by said estimation control means, and the estimation control means executing a step for obtaining an error correction information and a step for measurement; and said step for obtaining an error correction information comprising the steps of:

counting for a predetermined period of time an internal reference frequency and an absolute frequency, which is inputted from outside, at a plurality of temperature measuring points of said thermostatic oven measured by said temperature sensor, and determining a difference or a ratio of a result of said counting, storing in said memory means a minimum point temperature of crystal plate of said OCXO, said minimum point temperature being obtained from a value determined in said step of determining, setting a temperature of said thermostatic oven of said OCXO at said minimum point temperature, and storing in said memory means a correspondence relation as error correction information, said correspondence relation being between an absolute frequency to be taken as a reference and an internal reference frequency near said minimum point temperature and from said OCXO and obtained from said value determined in said step of determining, and said step of measurement comprising the steps of:

estimating, when said signal to be measured is input, a frequency of said signal to be measured in conformity with said internal reference frequency which is corrected by said error correction information, and displaying a result of said step of estimating on said display means.

7. A frequency measuring apparatus according to claim 6 wherein said OCXO includes a thermostatic oven control unit for controlling the temperature in the thermostatic oven to the minimum point temperature in conformity with the minimum point temperature information from said memory means.

8. A frequency measuring apparatus according to claim 6 wherein said estimation control means controls said memory means such that said memory means stores an aging property or identification information of said OCXO therein.

9. A frequency measuring method of measuring the frequency of an input signal to be measured with high accuracy comprising the steps of:

counting for a predetermined period of time an internal reference frequency and an absolute frequency, which is inputted from outside, at a plurality of temperature measurement points of an oven-controlled crystal oscillator (OCXO) using a thermostatic oven for generating said internal reference frequency, and determining a difference or a ratio of a result of said counting;

estimating minimum point temperature from information of the internal reference frequency at said plurality of temperature measurement points;

storing said estimated minimum point temperature in memory means;

setting a temperature in the thermostatic oven of said OCXO at said minimum point temperature in conformity with the minimum point temperature from said memory means;

measuring a correspondence relation between an absolute frequency to be taken as a reference at said minimum point temperature and the internal reference frequency from said OCXO near said minimum point temperature;

storing said measured correspondence relation as error correction information;

reading said error correction information from said memory means upon said input signal to be measured being input;

correcting said internal reference frequency based on said read error correction information and estimating the frequency of said input signal in conformity with the corrected internal reference frequency; and displaying a frequency value of said signal to be measured, said frequency value being obtained in said step of estimating.

* * * * *